(12) United States Patent
Saavedra et al.

(10) Patent No.: US 11,522,510 B2
(45) Date of Patent: Dec. 6, 2022

(54) HIGH OUTPUT CURRENT TRANSCONDUCTANCE AMPLIFIER

(71) Applicant: Queen's University at Kingston, Kingston (CA)

(72) Inventors: Carlos Saavedra, Kingston (CA); Arthur Liraneto Torres Costa, Sapiranga (BR)

(73) Assignee: Queen's University at Kingston, Kingston (CA)

( * ) Notice: Subject to any disclaimer, the term of this patent is extended or adjusted under 35 U.S.C. 154(b) by 239 days.

(21) Appl. No.: 16/889,973

(22) Filed: Jun. 2, 2020

(65) Prior Publication Data
US 2020/0389138 A1 Dec. 10, 2020

Related U.S. Application Data

(60) Provisional application No. 62/857,583, filed on Jun. 5, 2019.

(51) Int. Cl.
*H03F 3/45* (2006.01)
*H02M 3/156* (2006.01)
*H02M 1/00* (2006.01)

(52) U.S. Cl.
CPC ........ *H03F 3/45475* (2013.01); *H02M 3/156* (2013.01); *H02M 1/0009* (2021.05); *H02M 1/0025* (2021.05); *H03F 2203/45288* (2013.01)

(58) Field of Classification Search
CPC ....... H03F 3/45475; H03F 2203/45288; H03F 3/30; H03F 3/3033; H03F 2203/45138; H03F 2203/45528; H02M 3/156; H02M 1/0009; H02M 1/0025; H02M 1/08; H02M 3/158; H02M 7/53803

USPC .............................................. 330/252–261, 9
See application file for complete search history.

(56) References Cited

U.S. PATENT DOCUMENTS

| 4,965,529 | A | | 10/1990 | Laug | |
|---|---|---|---|---|---|
| 5,194,824 | A | * | 3/1993 | Wu | ........................ H03F 3/3081 330/255 |
| 7,215,198 | B1 | * | 5/2007 | Dasgupta | ............ H03F 3/45632 330/259 |

(Continued)

FOREIGN PATENT DOCUMENTS

WO    WO2012/151594 A2    11/2012

OTHER PUBLICATIONS

Laug, Owen B., "A 100 A, 100 kHz Transconductance Amplifer", IEEE Transactions on Instrumentation and Measurement, vol. 45, No. 3. pp. 440-444, (1996).

(Continued)

*Primary Examiner* — Samuel S Outten
*Assistant Examiner* — Khiem D Nguyen
(74) *Attorney, Agent, or Firm* — Stephen J. Scribner (57) ABSTRACT

A transconductance amplifier (TCA) implemented with high electron mobility transistors (HEMTs) in a push-pull amplifier output stage provides a voltage controlled constant high output current to loads ranging from 10 mΩ to 1Ω with a bandwidth of 25 MHz. A driving stage for the HEMTs is implemented with variable gain amplifiers that amplify the input voltage signal and provide bias for the HEMTs. An automatic gain control may be connected between the TCA output and the variable gain amplifiers to ensure a constant current output for a varying load.

17 Claims, 6 Drawing Sheets

(56) References Cited

U.S. PATENT DOCUMENTS

| | | |
|---|---|---|
| 9,716,477 B2 | 7/2017 | Wagh et al. |
| 2016/0036399 A1* | 2/2016 | McCune, Jr. ....... H03F 3/45179 330/251 |
| 2017/0019069 A1 | 1/2017 | Dunsmore |

OTHER PUBLICATIONS

Laug, Owen B., "A Wide-Band Transconductance Amplifier for Current Calibrations", IEEE Transactions on Instrumentation and Measurement, IM-34, No. 4, pp. 639-643, (1985).

Laug, Owen B., "A High-Current Very Wide-Band Transconductance Amplifier", IEEE Transactions on Instrumentation and Measurement, vol. 39, No. 1, pp. 42-47, (1990).

\* cited by examiner

FIG. 8 ered to as 'operational' transconductance amplifiers and they deliver output currents below about 100 mA. TCAs used in industrial applications typically require much higher output current, often in the tens of amperes.
HIGH OUTPUT CURRENT TRANSCONDUCTANCE AMPLIFIER

RELATED APPLICATION

This application claims the benefit of the filing date of Application No. 62/857,583, filed on Jun. 5, 2019, the contents of which are incorporated herein by reference in their entirety.

FIELD

This invention relates to transconductance amplifiers. In particular, this invention relates to transconductance amplifier topology implemented with high electron mobility transistors, with wide bandwidth and high current output.

BACKGROUND

Transconductance amplifiers (TCAs) accept an input voltage and generate an output current. TCAs are used in analog signal processing where they are building blocks in circuits such as tunable filters, oscillators, and other components. In such applications they are typically referred to as 'operational' transconductance amplifiers and they deliver output currents below about 100 mA. TCAs used in industrial applications typically require much higher output current, often in the tens of amperes.

Currently-available high-current TCAs are based on silicon transistors and their frequency response is limited to 100 kHz or less. Such TCAs use a parallel arrangement of many smaller TCA 'cells' each delivering up to 5 A of output current, because silicon transistors are limited in the amount of output current they can deliver at high frequencies.

SUMMARY

One aspect of the invention provides a transconductance amplifier, comprising: an input stage that receives an input voltage signal and outputs two voltage signals that are substantially equal in magnitude and opposite in phase; and a transconductance stage comprising at least two high electron mobility transistors (HEMTs) configured in a non-complementary push-pull arrangement; wherein the transconductance stage receives the two voltage signals and outputs a current signal.

In one embodiment, the input stage comprises an inverting amplifier and a non-inverting amplifier. In one embodiment, the inverting amplifier and the non-inverting amplifier provide DC biasing voltages to the at least two HEMTs.

In one embodiment, the transconductance amplifier includes an automatic gain control (AGC) feedback network that maintains an output current of the transconductance amplifier at a selected level as a transconductance amplifier load resistance varies.

In one embodiment, the AGC feedback network maintains an output current of the transconductance amplifier at a selected level by independently controlling a gate voltage of each of the at least two HEMTs.

In one embodiment, the AGC feedback network comprises a first variable gain amplifier (VGA) that drives the inverting amplifier, and a second VGA that drives the non-inverting amplifier.

In one embodiment, the AGC feedback network senses a transconductance amplifier output current and produces control signals for the first and second VGAs.

In one embodiment, the control signals for the first and second VGAs are produced according to a low pass filter transfer function.

In one embodiment, the transconductance amplifier has a bandwidth from DC to at least 100 MHz and an output current up to at least 7 A peak magnitude.

According to embodiments, the at least two HEMTs may comprise a semiconductor material selected from gallium nitride (GaN), gallium arsenide (GaAs), and indium phosphide (InP). In certain embodiments the at least two HEMTs comprise GaN.

Another aspect of the invention provides a transconductance amplifier comprising two or more cells, wherein each cell comprises a transconductance amplifier as described herein.

Another aspect of the invention provides methods for implementing a transconductance amplifier having a transconductance stage comprising at least two HEMTs, according to embodiments described herein.

BRIEF DESCRIPTION OF THE DRAWINGS

For a greater understanding of the invention, and to show more clearly how it may be carried into effect, embodiments will be described, by way of example, with reference to the accompanying drawings, wherein.

DETAILED DESCRIPTION OF EMBODIMENTS

Described herein is a TCA topology based on high electron mobility transistors (HEMTs) in a main transconductance stage. Embodiments provide TCAs with frequency response up to tens of MHz and an output current of a single TCA cell up to at least 5 A. Thus, embodiments provide TCAs with bandwidths and output currents that are significantly higher than those of currently-available TCAs. HEMTs advantageously support high power, high temperature operation, and can operate in frequencies in the gigahertz range. Using such devices provides for high current operation in the megahertz range, both of which are desired characteristics for a TCA.

A limitation of such HEMTs is that only N-type devices are available at present and P-type devices are not. This makes TCA design more challenging, since the output stage cannot be implemented in a complementary push-pull configuration as in silicon-based designs using NPN and PNP bipolar transistors or CMOS transistors. Embodiments described herein overcome the limitation imposed by absence of P-type HEMT devices by employing design features that permit implementation using N-type HEMTs in a push-pull configuration. Although embodiments are described in detail below based on gallium nitride (GaN) HEMTs, it will be appreciated that they may be also be implemented using HEMTs based on gallium arsenide (GaAs), indium phosphide (InP), or similar semiconductor materials that provide high electron mobility.

High-Output Current Transconductance Stage

Figure 1:
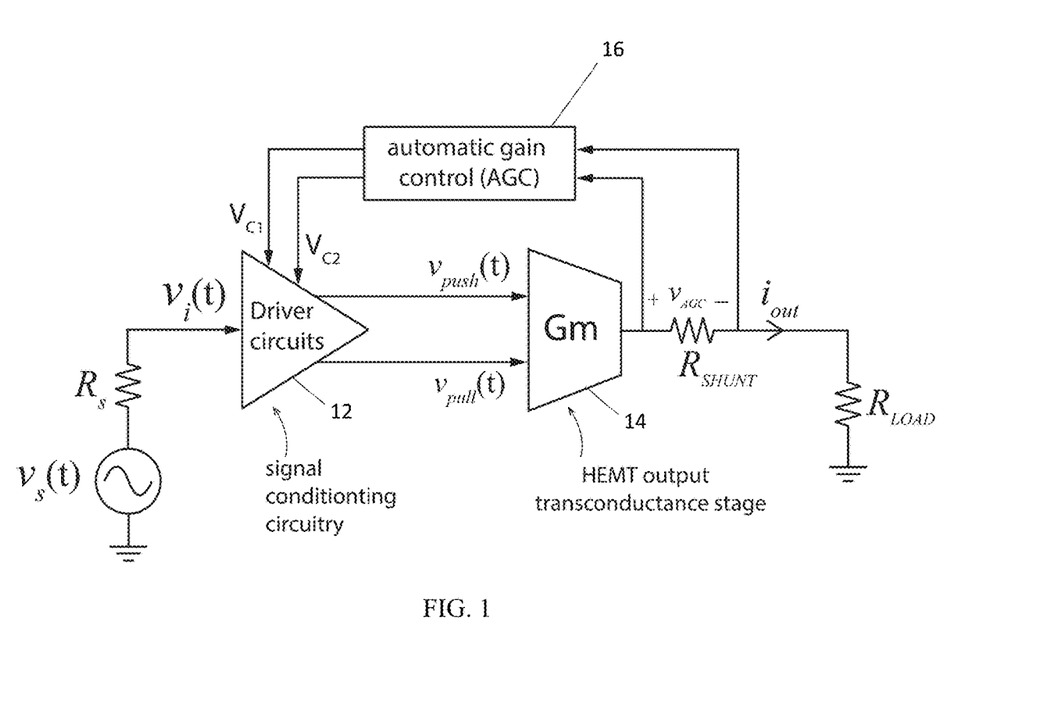
FIG. 1 is a transconductance amplifier (TCA) topology block diagram, according to one embodiment of the invention.

FIG. 1 shows a block diagram of a TCA topology according to one embodiment. According to this embodiment, the input voltage signal $v_i$ is fed to signal conditioning circuits 12 that yield two waveforms, $v_{push(t)}$ and $v_{pull(t)}$, that have substantially opposite phases (i.e., they are antiphase) to drive a high output current transconductance stage. The phases are ideally opposite in that they are 180 degrees out of phase, but mismatches in the circuitry due to component tolerances, etc., may lead to small phase imbalances. A transconductance stage 14, $G_m$, carries out the voltage-to-current conversion step in the TCA and is implemented using HEMTs configured in a non-complementary push-pull, class AB arrangement. As shown in FIG. 1, the TCA may optionally be implemented with an automatic gain control (AGC) feedback network 16 to keep the output current $i_{out}$ at a selected level as the load resistance of the TCA output varies.

Figure 2:
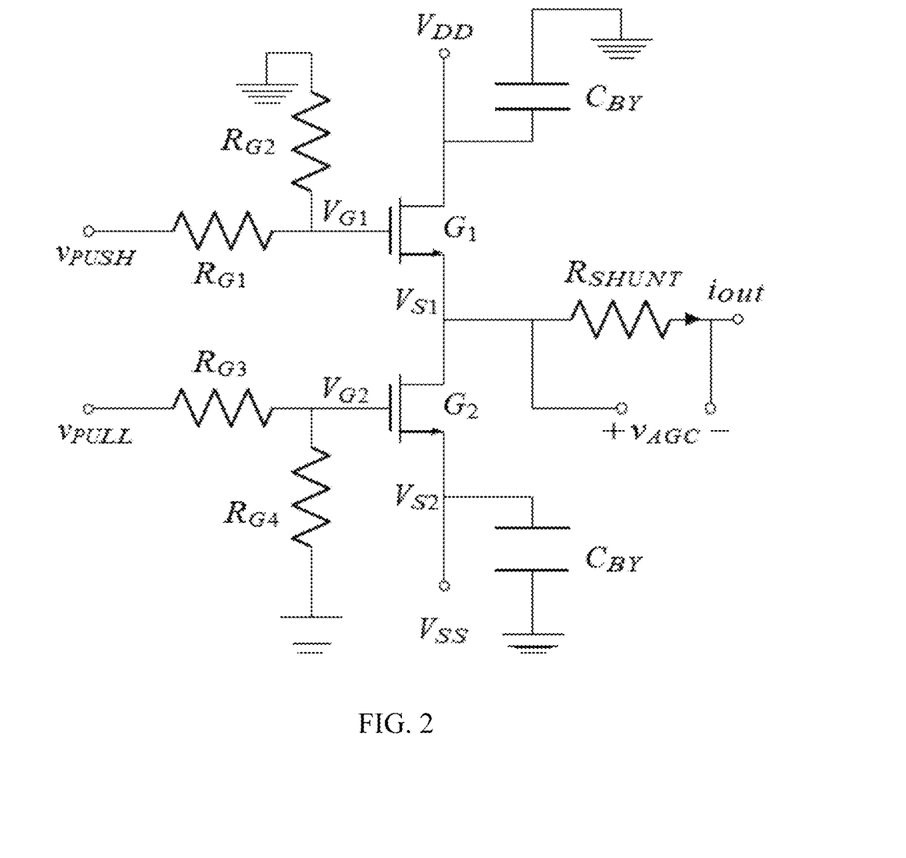
FIG. 2 is a schematic diagram showing a high electron mobility transistor (HEMT) output stage of a TCA, according to one embodiment.

FIG. 2 shows a transistor-level schematic diagram of the high output current transconductance stage, according to one embodiment. In FIG. 2 the HEMTs, $G_1$ and $G_2$ are arranged in a class AB configuration. The HEMTs may be depletion mode GaN HEMT metal-semiconductor junction devices that are normally on for $V_{GS}=0$ or higher. To turn off the transistor, a negative $V_{GS}$ voltage is applied until the device channel is closed. Proper biasing and selection of $V_{DD}$ and $V_{SS}$ may be determined as described in the below example. It will be appreciated that the TCA topology embodiments described herein may be implemented in depletion or enhancement mode HEMTs. In embodiments where an AGC is implemented, the $G_m$ stage may include a small high-precision resistor, $R_{SHUNT}$, with a small value of, e.g., 10 m$\Omega$, that is used to sense the output current by measuring the voltage drop across it. The voltage across $R_{SHUNT}$ is used by the AGC feedback circuit.

In some embodiments, the $G_m$ stage may include a supply filter. For example, as shown in the embodiment of FIG. 2, the $G_m$ stage may include a supply filter comprising bypass capacitors $C_{BY}$, which are connected in shunt to the power supply terminals to mitigate output current noise.

Driver Stage

The driver circuitry may be implemented using any conveniently available low to medium-power (e.g., mW) technology, which facilitates meeting the high frequency requirement (MHz-GHz), such as commercially-available, off-the-shelf, silicon components. Alternatively, the driver circuity may be implemented at least partially in a high electron mobility semiconductor material such as GaN. The purpose of the driver circuitry is to convert a single-ended input signal, $v_i$, into balanced signals $v_{push(t)}$ and $v_{pull(t)}$, i.e., signals that differ in phase to switch the output stage in different time frames. The drivers may also provide voltage amplification and they may provide gate bias voltage to the HEMTs in the output stage.

Figure 4:
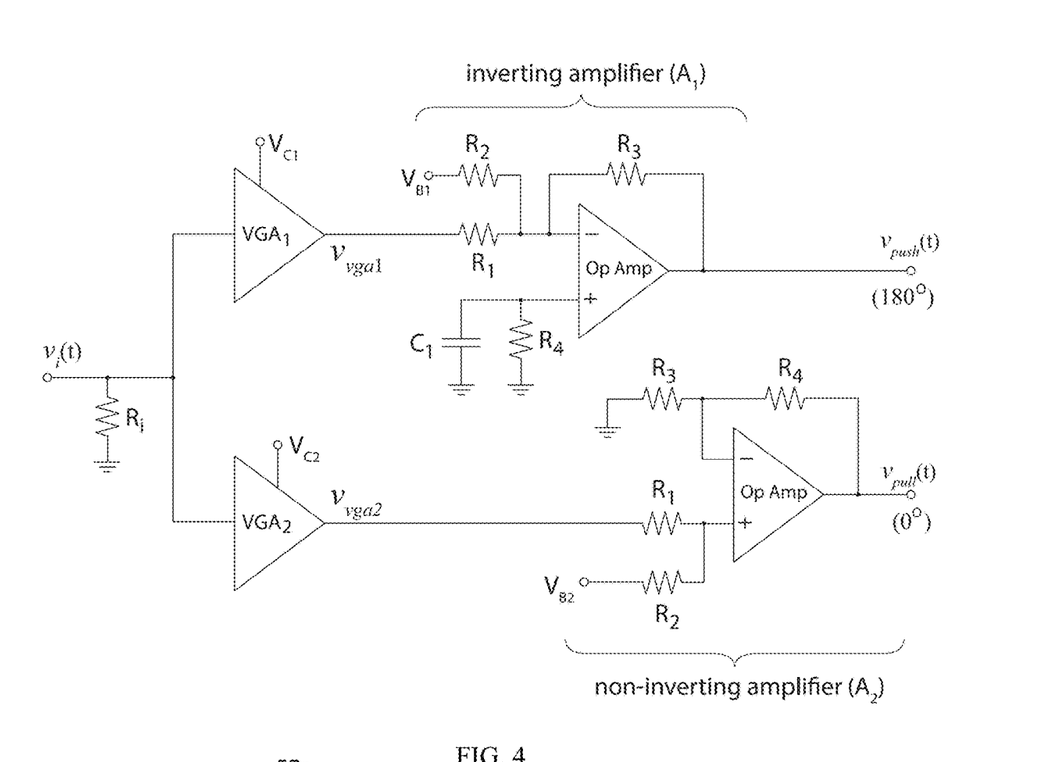
FIG. 4 is a schematic diagram showing a first stage driver circuit suitable for driving the output transconductance stage of FIG. 2, according to one embodiment.

A schematic diagram of a driver circuitry example according to one embodiment is shown in FIG. 4. In FIG. 4, the driver circuitry includes two variable gain stages (VGA$_1$ and VGA$_2$) and an inverting amplifier (A$_1$) and a non-inverting amplifier (A$_2$) to generate the balanced signals for the output transconductance stage.

The input voltage to the drivers is $v_{i(t)}=v_s(t)R_i/(R_s+R_i)$, where $R_i$ is an input shunt resistor with a value of 1 M$\Omega$ and is used to provide a DC path to ground when the external input signal is not present. Since $R_i \gg R_s$, it follows that $v_{i(t)} \approx v_{s(t)}$.

The VGAs are used by the AGC feedback system to change the magnitude of the input signal in order to adjust the TCA output current for varying $R_{LOAD}$ conditions. The VGA$_1$ and VGA$_2$ output signals $v_{vga1}$ and $v_{vga2}$ are controlled by the feedback voltages $V_{C1}$ and $V_{C2}$, respectively, and are given by $$v_{vga1}(t) = f_1(V_{C1})v_i(t) \quad (1)$$

$$v_{vga2}(t) = f_2(V_{C2})v_i(t) \quad (2)$$

where the VGA transfer functions are designed such that they stay within a specified range given by $0 < f_1(V_{C1}) < 1$ and $0 < f_2(V_{C2}) < 1$. The inverting and non-inverting voltage amplifiers, A$_1$ and A$_2$, respectively, are used to generate the balanced signals and are described by the expressions $$v_{push}(t) = -f_1(V_{C1})\left(\frac{R_3}{R_1}\right)v_1(t) - \left(\frac{R_3}{R_2}\right)V_{B1} \quad (3)$$

$$v_{pull}(t) = F_2(V_{C2})\left(1 + \frac{R_4}{R_3}\right)\left(\frac{R_1}{R_1+R_2}\right)v_1(t) + \left(1 + \frac{R_4}{R_3}\right)\left(\frac{R_2}{R_1+R_2}\right)V_{R2} \quad (4)$$

where $V_{B1}$ in eq. (3) is a DC voltage to provide biasing at the gate terminal of GaN transistor $G_1$ in FIG. 2 and, similarly, $V_{B2}$ in eq. (4) is used to provide DC biasing at the gate of GaN transistor $G_2$. The resistor values $R_1$ to $R_4$ in eq. (3) and (4) are chosen such that the AC components of $v_{push}(t)$ and $v_{pull}(t)$ have equal amplitudes when the condition $f_1(V_{C1}) = f_2(V_{C2})$ is satisfied.

Automatic Gain Control (AGC)

As noted above, embodiments may include an AGC feature. The AGC adjusts the $v_{push}(t)$ and $v_{pull}(t)$ signals to keep the output HEMT VGS voltages at the proper value to maintain the selected output current level. Since the TCA output stage is implemented in a non-complementary push-pull configuration, two separate error amplifiers are needed in the AGC, as shown in the embodiment of FIG. 5, because each HEMT output transistor has a different requirement for gate voltage adjustment for a varying load.

Figure 5:
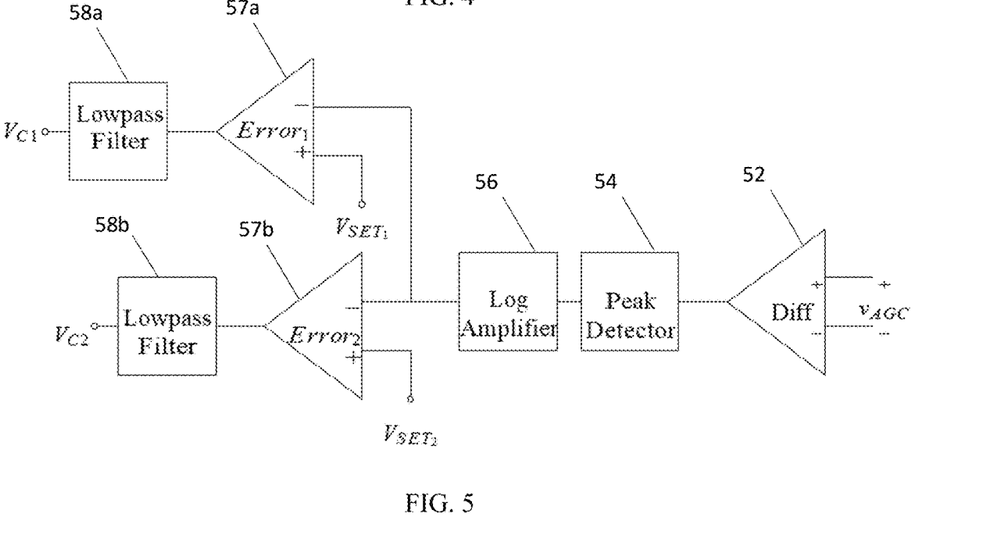
FIG. 5 is a schematic diagram of an AGC feedback system, according to one embodiment.

Referring to FIG. 5, the AGC senses the output current produced by the TCA as a voltage drop across the precision resistor $R_{SHUNT}$ in FIG. 1 such that $v_{AGC}=i_{out}R_{SHUNT}$. A high-input impedance differential amplifier 52 with unity gain is used to isolate the AGC circuit from the TCA output. The unity-gain buffer also converts the $v_{AGC}$ differential waveform to a single-ended waveform which is then fed to a peak detector 54 that produces a DC voltage equal to the amplitude of $v_{AGC}$. If linear (in decibel (dB)) amplifiers are used for the VGAs, a logarithmic amplifier 56 may be connected after the peak detector as shown in FIG. 5.

In FIG. 5 the error amplifiers 57a, 57b are differential amplifiers, which may be implemented with OPAMPs. They produce a voltage that is the difference between the log of the peak detector output voltage, $A_{V_{Log}} \cdot \log(v_{PD})$ and a reference voltage $V_{SET1,2}$ that is determined by the output current level selected. Low-pass filters 58a, 58b may be used after the error amplifiers to remove ripple noise and produce cleaner signals at the output of the AGC block, as shown in FIG. 5. The AGC outputs are given by $$V_{C1} = A_{V_{ERROR1}}(A_{V_{Log}} \cdot \log(v_{PD}) - V_{SET1})H(\omega) \quad (5)$$

$$V_{C2} = A_{V_{ERROR2}}(A_{V_{Log}} \cdot \log(v_{PD}) - V_{SET2})H(\omega) \quad (6)$$

where $H(\omega)$ is the transfer function of the low pass filter. The voltage gain, $A_{V_{ERROR}}$ scales the output of the Log amplifier for the desired range of $V_{C1}$ and $V_{C2}$ Applications Commercially-available TCAs use an array of smaller TCA cells arranged in parallel to produce output currents of 100 amperes or more. A TCA such as described herein is a single cell, and multiple such cells may be arranged in an array to produce higher output currents.

Table I presents a bandwidth comparison between a TCA cell as described herein and commercially-available TCAs. A TCA topology according to the embodiments described herein exhibits a bandwidth 250 times larger than the best TCA bandwidth currently available. The superior high frequency performance of the HEMTs is related to the high temperature capability of the devices which allows them to operate at the same output current levels or higher than silicon-based TCAs.

TABLE I

Bandwidth comparison with commercially-available TCAs.

| Manufacturer | Model | Bandwidth (kHz) |
| --- | --- | --- |
| Powertek | MC151 | DC-1 |
| Ballantine Laboratories | 1620A | DC-10 |
| Fluke | 52120A | DC-10 |
| Clarke-Hess | 8100 | DC-100 |
| Guildline Instruments | 7810 | DC-100 |
| This disclosure |  | DC-25,000 |

TCAs based on the embodiments and teachings described herein may be used in diverse applications. For example, monitoring of power flow in electrical distribution networks in real-time is essential to maintain quality of service. Power flow measurements are typically carried out using a current transformer and an ammeter. A primary current, $i_p$, flowing through the power line produces a magnetic field that is confined and accentuated by the ferromagnetic core that surrounds the power line. Wrapped around the core is a winding that produces a small secondary current, $i_s$, which is sensed by the ammeter. The ammeter then back-calculates $i_p$ from the measured $i_s$ and displays a value for $i_p$. The relationship between $i_p$ and $i_s$ is not trivial and depends on the number of windings in the secondary path, the permeability and cross-sectional area of the core, plus the inner workings of the ammeter itself. Calibration of this current measurement system is performed at regular intervals and relies on high-accuracy TCAs. The TCA feeds a precisely known test current to the system and the error between the ammeter's current readout and the test current is recorded.

Another application is in metal detectors, which are ubiquitous at security checkpoints in airports, government buildings, etc., are also used for landmine detection. Such detectors constitute an important application for TCAs because they use current pulses applied to large conducting coils to produce a time-varying magnetic field. When a metallic object passes by the detector, the induced currents in the object will scatter back a magnetic field of opposite polarity which is detectable by various methods as known in the art.

The need to generate precise current pulses for magnetic field generation also arises in high-energy particle accelerators such as the Large Hadron Collider at the European Organization for Nuclear Research (CERN).

Arc welding uses a large electric current to melt and fuse metal objects together in a localized region. When the molten region cools, a metallurgical bond is created between the objects whose strength properties are the same as those of the original metal parts. Arc welders may use either DC or AC currents depending on the type of materials to be bonded. Current drive levels for AC welders can range from 20-60 A at frequencies up to 125 kHz. Arc welding is critical for industrial manufacturing (e.g., ship building, heavy equipment, automobiles) and for construction and welders are increasingly relying on TCAs in their power sources.

It will be appreciated that a TCA as described herein would be ideally suited to such applications.

EXAMPLE

A TCA was built based on the circuits shown in FIGS. 1, 2, 4, and 5 using GaN HEMTs for the transconductance stage.

Figure 3:
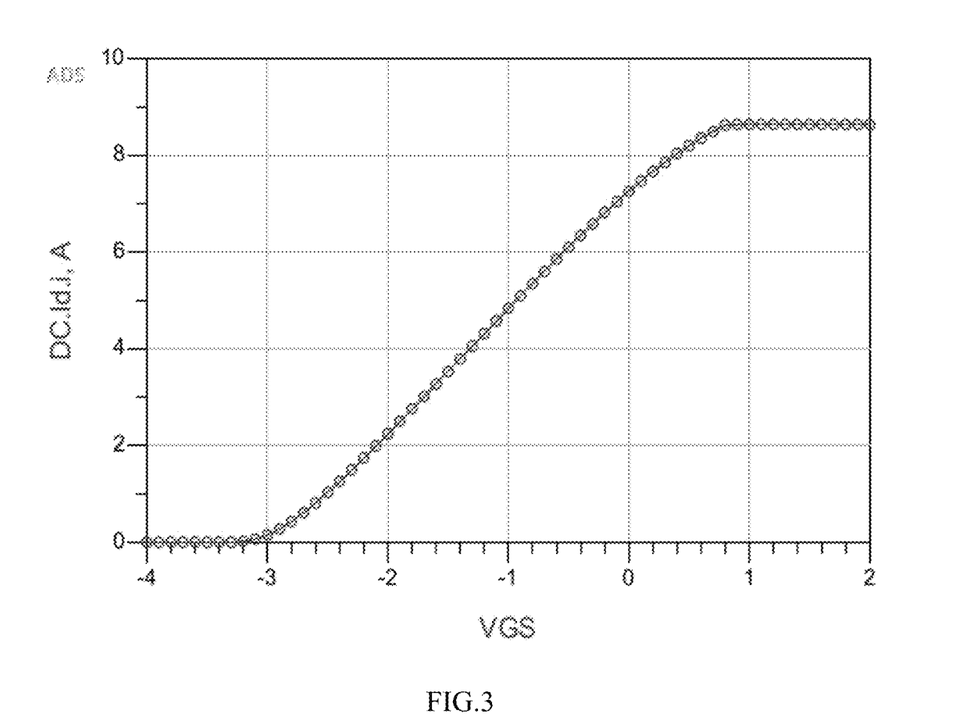
FIG. 3 is a plot showing a DC current-voltage characteristic of a GaN HEMT used in an embodiment of the invention.

The HEMTs are metal-semiconductor junction devices, meaning that at VGS=0 V they conduct maximum current. To shut off the transistor, a negative VGS voltage is applied until the device channel is pinched off. The IDS versus VGS characteristic of a GaN transistor suitable for embodiments described herein (CGH40035F; Cree, Inc., Durham, N.C., USA) is plotted in FIG. 3. The plot was generated using the circuit model provided by the manufacturer and shows that the device has a nominal pinch-off voltage of $V_{th}=-3$ V. The nominal DC power rating of the transistor is 35 W and this value is used to select the transistor DC bias points and the power supply voltages. For a peak AC output current of 5 A, for example, the $V_{DS}$ for each transistor was set to 7 V in order to comply with the power rating. Considering the basic case of a balanced TCA output of 0 V means that $V_{S1}=V_{D2}=0$ V in FIG. 2 and therefore, $V_{DD}=7$ V and $V_{SS}=-7$ V. The incident antiphase signals, $v_{push}(t)$ and $v_{pull}(t)$, also have DC offsets that provide the gate bias voltages to the GaN devices once they are appropriately scaled using resistive voltage dividers. For push-pull Class AB operation, the gate-source bias voltages $V_{GS1,2}$ for the transistors are made slightly higher than $V_{th}$. For the push transistor, $G_1$, the gate voltage is set to $V_{G1}=-2.8$ V and for the pull transistor, $G_2$, the gate voltage is $V_{G2}=V_{SS}-2.8$ V=−9.8 V.

For the driver circuitry, the VGAs were implemented with LMH6505 from Texas Instruments Inc. (Dallas, Tex., USA). These amplifiers have 100 MHz bandwidth and they are linear in dB, hence the logarithmic amplifiers were connected after the peak detector in FIG. 5.

An open-loop TCA (i.e., without the AGC block) was setup in three separate printed circuit boards (PCBs): one for the driver circuitry (low power), one for the output stage (high power) and one for the load ($R_{LOAD}$). The PCBs were connected with banana cables. The objective of the open-loop measurements was to evaluate the TCA output current, bandwidth, and output current magnitude control using the TCA input voltage.

Open-Loop TCA Measurements

The open-loop TCA was tested using $R_{SHUNT}=100$ m$\Omega$ and $R_{LOAD}=10$ m$\Omega$. The input signal frequency was swept from DC to 25 MHz and the voltage $v_{AGC}$ across $R_{SHUNT}$ was measured, from which the output current was determined using $i_{out}=v_{AGC}/R_{SHUNT}$.

$v_{AGC}$ was measured with $v_i=1.5$ V for four representative frequencies: DC, 10 Hz, 100 kHz and 25 MHz. The time domain waveforms showed no crossover distortion, as expected from a class AB output stage.

Figure 6:
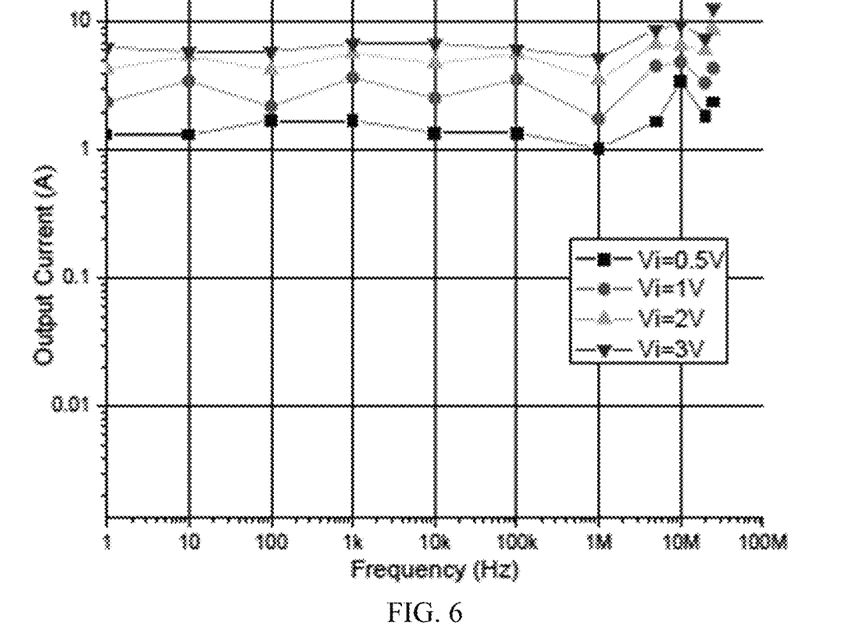
FIG. 6 is a plot showing measured open-loop TCA output current frequency response from 1 Hz to 25 MHz for several values of input voltage $v_i(t)$, for an experimental prototype.

The measured TCA output current frequency response for input amplitude voltages $v_i(t)$ of 0.5 V, 1 V, 2 V and 3 V is shown in FIG. 6. For the case of 3 V input voltage, the average output current from 1 Hz to 1 MHz is 6.2 A and then gradually rises above 1 MHz to achieve a maximum of 12.9 A at 25 MHz. This peaking behavior is caused by the parasitic inductance of the load.

Figure 7:
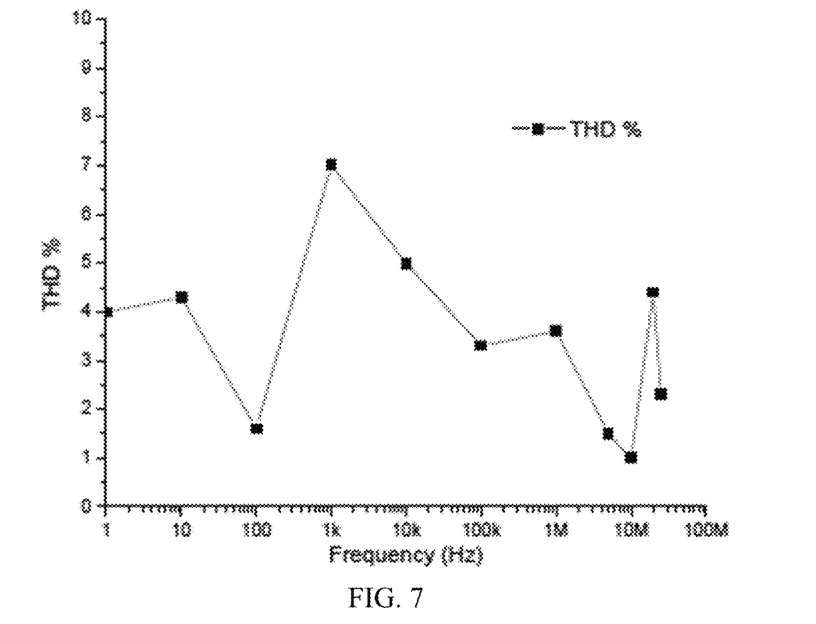
FIG. 7 is a plot showing THD results for an open-loop TCA with input voltage amplitude of 3 V, for an experimental prototype.

The total harmonic distortion (THD) of the output current waveform was determined at each measured frequency point for the case of an input voltage amplitude of 3 V, which corresponds to the condition of maximum output current of the TCA. The THD was calculated from the FFT of the time-domain waveforms. The THD results are plotted in FIG. 7 and show that THD is below 7% throughout the 25 MHz band. The minimum THD was 1% at 10 MHz.

Temperature of the GaN HEMT output stage was measured with a Fluke VT04 visual IR thermometer. The maximum package temperature was 83° C., which is well below the maximum rating of 150° C. The cooling solution used for this prototype was basic and consisted of two small heatsinks and fans. Using larger heatsinks and an optimized airflow design will further reduce the operating temperature of the GaN devices, allowing higher output power and output current of, e.g., 7 A peak.

AGC simulation results

Figure 8:
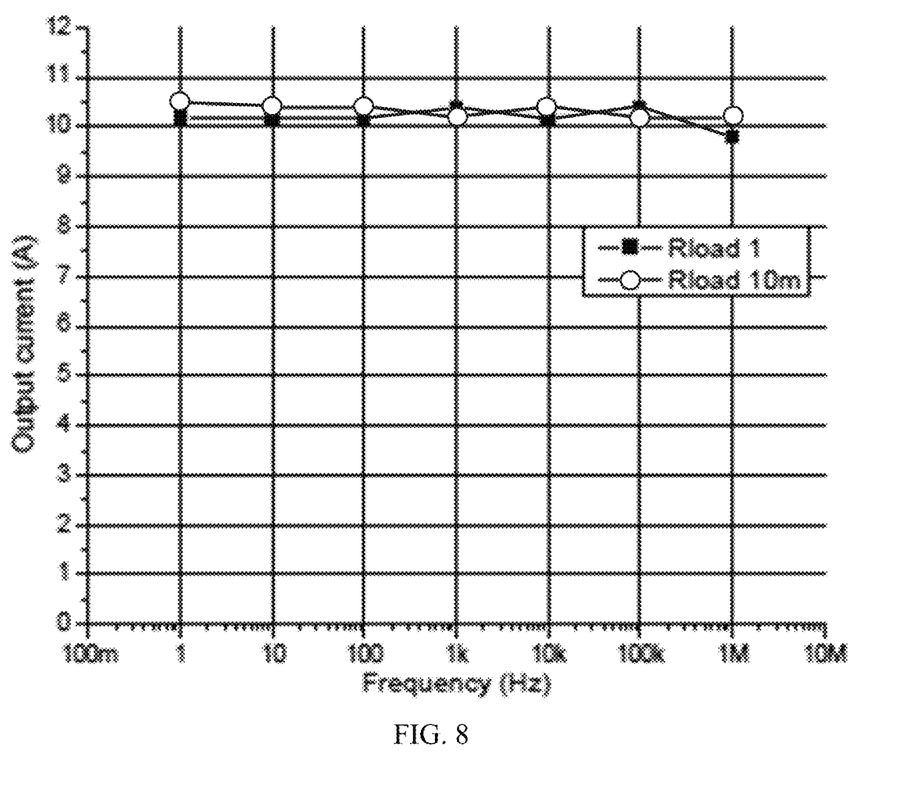
FIG. 8 is a plot showing closed-loop TCA output current for load values of 10 mΩ to 1Ω in the frequency range of 1 Hz to 1 MHz, obtained in a simulation of an embodiment.

The AGC implementation was carried out in simulation using the Advanced Design System™ (ADS) software from Keysight Technologies Inc. (Mississauga, Ontario, Canada). The frequency span was 1 Hz to 1 MHz. The load values ranged from 10 m$\Omega$ to 1$\Omega$. The simulated results are shown in FIG. 8 for the load values of 10 m$\Omega$ and 1$\Omega$. The output current level was selected to be 10.5 A peak-to-peak.

Inspection of time domain waveforms for the simulated output current for the load values of 10 m$\Omega$ and 1$\Omega$ at DC, 10 Hz, 100 kHz and 1 MHz revealed that the AGC was able to operate under the varying load, maintaining a TCA output current of 5 A from DC to 1 MHz.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A transconductance amplifier (TCA), comprising:
an input stage comprising an inverting amplifier and a non-inverting amplifier that receives an input voltage signal and outputs two voltage signals that are substantially equal in magnitude and opposite in phase;
a transconductance stage comprising at least two high electron mobility transistors (HEMTs) configured in a non-complementary push-pull arrangement; and
an automatic gain control (AGC) feedback network comprising a first variable gain amplifier (VGA) that drives the inverting amplifier and a second VGA that drives the non-inverting amplifier;
wherein the transconductance stage receives the two voltage signals from the input stage and outputs a current signal.

2. The transconductance amplifier of claim 1, wherein the inverting amplifier and the non-inverting amplifier provide DC biasing voltages to the at least two HEMTs.

3. The transconductance amplifier of claim 1, wherein the AGC feedback network maintains an output current of the transconductance amplifier at a selected level as a transconductance amplifier load resistance varies.

4. The transconductance amplifier of claim 3, wherein the AGC feedback network maintains an output current of the transconductance amplifier at a selected level by independently controlling a gate voltage of each of the at least two HEMTs.

5. The transconductance amplifier of claim 1, wherein the AGC feedback network senses a transconductance amplifier output current and produces control signals for the first and second VGAs.

6. The transconductance amplifier of claim 5, wherein the control signals for the first and second VGAs are produced according to a low pass filter transfer function.

7. The transconductance amplifier of claim 1, wherein the transconductance amplifier has a bandwidth from DC to at least 100 MHz.

8. The transconductance amplifier of claim 1, wherein the at least two HEMTs comprise a semiconductor material selected from gallium nitride (GaN), gallium arsenide (GaAs), and indium phosphide (InP).

9. The transconductance amplifier of claim 1 implemented as a TCA cell;
wherein two or more TCA cells are arranged in an array.

10. A method for implementing a transconductance amplifier, comprising:
using an input stage comprising an inverting amplifier and a non-inverting amplifier to receive an input voltage signal and output two voltage signals that are substantially equal in magnitude and opposite in phase;
using the two output voltage signals to drive a transconductance stage comprising at least two high electron mobility transistors (HEMTs) configured in a non-complementary push-pull arrangement; and
using an automatic gain control (AGC) feedback network comprising a first variable gain amplifier (VGA) to drive the inverting amplifier and a second VGA to drive the non-inverting amplifier;
wherein the transconductance stage receives the two voltage signals from the input stage and outputs a current signal.

11. The method of claim 10, wherein the inverting amplifier and the non-inverting amplifier provide DC biasing voltages to the at least two HEMTs.

12. The method of claim 10, wherein the AGC feedback network maintains an output current of the transconductance amplifier at a selected level as a transconductance amplifier load resistance varies.

13. The method of claim 12, wherein the AGC feedback network maintains an output current of the transconductance amplifier at a selected level by independently controlling a gate voltage of each of the at least two HEMTs.

14. The method of claim 10, wherein the AGC feedback network senses a transconductance amplifier output current and produces control signals for the first and second VGAs.

15. The method of claim 14, wherein the control signals for the first and second VGAs are produced according to a low pass filter transfer function.

16. The method of claim 10, wherein the transconductance amplifier has a bandwidth from DC to at least 100 MHz.

17. The method of claim 10, wherein the at least two HEMTs comprise a semiconductor material selected from gallium nitride (GaN), gallium arsenide (GaAs), and indium phosphide (InP).

\* \* \* \* \*